US007018575B2

(12) United States Patent
Brewer et al.

(10) Patent No.: US 7,018,575 B2

(45) Date of Patent: Mar. 28, 2006

(54) METHOD FOR ASSEMBLY OF COMPLEMENTARY-SHAPED RECEPTACLE SITE AND DEVICE MICROSTRUCTURES

(75) Inventors: Peter D. Brewer, Westlake Village, CA (US); Andrew T. Hunter, Woodland Hills, CA (US); Luisa M. Deckard, College Station, TX (US)

(73) Assignee: HRL Laboratories, LLC, Malibu, CA (US)

( * ) Notice: Subject to any disclaimer, the term of this patent is extended or adjusted under 35 U.S.C. 154(b) by 457 days.

(21) Appl. No.: 10/218,052

(22) Filed: Aug. 12, 2002

(65) Prior Publication Data

US 2003/0068519 A1 Apr. 10, 2003

Related U.S. Application Data

(60) Provisional application No. 60/326,055, filed on Sep. 28, 2001.

(51) Int. Cl.
*H01L 21/00* (2006.01)
*B29C 59/00* (2006.01)
*B28B 5/00* (2006.01)

(52) U.S. Cl. ...................... 264/108; 264/129; 264/220; 264/241; 264/291.7; 438/107; 438/689; 438/694; 216/2; 216/13

(58) Field of Classification Search .................... 216/2, 216/13; 264/108, 129, 219, 241, 297.1, 220; 438/107, 689, 694

See application file for complete search history.

(56) References Cited

U.S. PATENT DOCUMENTS 4,912,844 A 4/1990 Parker ......................... 29/848
5,161,093 A 11/1992 Gorczyca et al. ........... 361/414

(Continued)

FOREIGN PATENT DOCUMENTS

EP 0 982 385 A1 3/2000

(Continued)

OTHER PUBLICATIONS

Terfort, A., et al., "Three-dimensional self-assembly of millimetre-scale components," *Nature*, vol. 386, pp 162-164 (Mar. 13, 1997).

(Continued)

*Primary Examiner*—Stephen Stein
(74) *Attorney, Agent, or Firm*—Ladas & Parry LLP

(57) ABSTRACT

A method for assembly including the steps of:

(a) providing a plurality of microstructure components with each of the components having a bottom with the same three dimensional shape;

(b) forming a mold with at least one protuberance from a surface thereof so that the at least one protuberance has the same shape;

(c) molding a moldable substrate with the mold to form a molded substrate having a surface with at least one recess having the same shape; and (d) positioning a first of the plurality of microstructure components into said at least one recess. Each of the microstructure components may be formed by a masking and etching process, with the mold being formed by the same masking and etching process. The positioning step may consist of mixing the microstructure components with a fluid to form a slurry; and depositing the slurry on the surface of the molded substrate to cause the first of the plurality of microstructure components to self-align in the recess.

17 Claims, 7 Drawing Sheets

U.S. PATENT DOCUMENTS

| | | | | |
|---|---|---|---|---|
| 5,284,548 | A | 2/1994 | Carey et al. | 156/630 |
| 5,312,765 | A | 5/1994 | Kanber | 437/22 |
| 5,353,498 | A | 10/1994 | Fillion et al. | 29/840 |
| 5,485,038 | A | 1/1996 | Licari et al. | 257/758 |
| 5,545,291 | A | 8/1996 | Smith et al. | 156/655.1 |
| 5,609,907 | A | 3/1997 | Natan | 427/2.12 |
| 5,751,018 | A | 5/1998 | Alivisatos et al. | 257/64 |
| 5,772,905 | A | 6/1998 | Chou | 216/44 |
| 5,783,856 | A | 7/1998 | Smith et al. | 257/618 |
| 5,800,650 | A | 9/1998 | Anderson et al. | 156/150 |
| 5,824,186 | A * | 10/1998 | Smith et al. | 438/597 |
| 5,877,550 | A | 3/1999 | Suzuki | 257/700 |
| 5,904,545 | A | 5/1999 | Smith et al. | 438/455 |
| 6,037,255 | A | 3/2000 | Hussein et al. | 438/675 |
| 6,096,386 | A | 8/2000 | Biebuyck et al. | 427/510 |
| 6,165,911 | A | 12/2000 | Calveley | 438/754 |
| 6,294,741 | B1 | 9/2001 | Cole, Jr. et al. | 174/260 |
| 6,326,058 | B1 | 12/2001 | Biebuyck et al. | 457/261 |
| 6,417,025 | B1 * | 7/2002 | Gengel | 438/107 |
| 6,479,395 | B1 * | 11/2002 | Smith et al. | 438/723 |
| 6,500,694 | B1 | 12/2002 | Enquist | 438/109 |
| 6,541,346 | B1 | 4/2003 | Malik | 438/316 |
| 6,579,463 | B1 | 6/2003 | Winningham et al. | 216/41 |
| 6,611,237 | B1 * | 8/2003 | Smith | 343/772 |
| 6,656,568 | B1 | 12/2003 | Winningham et al. | 428/145 |
| 6,657,289 | B1 * | 12/2003 | Craig et al. | 257/678 |
| 2002/0045030 | A1 | 4/2002 | Ozin et al. | 428/173 |
| 2003/0062123 | A1 | 4/2003 | Hunter et al. | 156/310 |
| 2003/0112576 | A1 | 6/2003 | Brewer et al. | 361/119 |
| 2003/0140317 | A1 | 7/2003 | Brewer et al. | 716/1 |

FOREIGN PATENT DOCUMENTS

| | | |
|---|---|---|
| JP | 10-022338 | 1/1998 |
| WO | 01/33300 A2 | 5/2001 |

OTHER PUBLICATIONS

"Use of High Precision Silicon Molds for Replicating Microelectronic Packaging Structures," *IBM Techincal Disclousre Bulletin*, vol. 30, No. 5, pp 306-311 (Oct. 1987).

"Method to Control the Geometry and Vertical Profile of Via Holes in Substrate Materials," *IBM Technical Disclosure Bulletin*, vol. 35, No. 5, pp 211-216 (Oct. 1992).

Chou, Stephen Y., et al, "Imprint of Sub-25 NM Vias and Trenches in Polymers," *Applied Physics Lett.*, American Institute of Physics, vol. 67, No. 21, pp. 3114-3116 (Nov. 20, 1995).

Chou, Stephen Y., et al, "Nanoimprint Lithography," *J. Vac Sci. Technol. B*, American Vacuum Society, vol. 14, No. 6, pp. 4129-4133 (Nov./Dec. 1996).

Terfort, Andreas, et al, "Self-Assembly Of An Operating Electrical Circuit Based On Shape Complementarity And The Hydophobic Effect," *Advanced Materials*, vol. 10, No. 6, pp. 470-473, (1998).

Bobbio, S.M., et al., "Integrated Force Arrays," *IEEE Proceedings of the Workshop on Micro Electro Mechanical Systems* (*MEMS*), Fort Lauderdale, pp 149-154 (Feb. 7-10, 1993).

Srinivasan, U., et al., "Fluidic Self-Assembly of Micromirrors onto Surface Micromachined Actuators," *IEEE*, pp 59-60, (2000).

Srinivasan, U., et al., "Microstructure to Substrate Self-Assembly Using Capillary Forces," *Journal of Microelectromechanical Systems*, vol. 10, No. 1, pp 17-24 (Mar. 2001).

Borenko, T., et al., "Polymer bonding process for nanolithography," *Applied Physics Letters*, vol. 79, No. 14, pp 2246-2248 ( Oct. 1, 2001).

Chou, S.Y., et al., "Imprint of sub-25 nm vias and trenches in polymers," *Appl. Phys. Lett.*, vol. 67, No. 21, pp 3114-3116 (Nov. 20, 1995).

Chou, S.Y., et al., "Nanoimprint lithography," *J. Vac Sci. Technol. B* , vol. 14, No. 6, pp 4129-4113 (Nov./Dec. 1996).

Tormen, M., et al., "Thermocurable polymers as resists for imprint lithography," *Electronics Letters*, vol. 36, No. 11, pp 983-984 (May 25, 2000).

Zhang, W., et al., "Multilevel nanoimprint lithography with submicron alignment over 4 in. Si wagers," *Applied Physics Letters*, vol. 79, No. 6, pp 845-847 (Aug. 6, 2001).

Hao, E., et al., "Buildup of Polymer/Au Nanoparticle Multilayer Thin Films Based on Hydrogen Bonding," *Chem. Mater.*, vol. 12, No. 11, pp. 3392-3396 (2000).

Kumar, A., et al., "Pattering Self-Assembled Monolayers: Applications in Materials Science," *Langmuir*, vol. 10, No. 5, pp. 1498-1511 (1994).

U.S. Appl. No. 10/888,169 by Peter D. Brewer, filed Jul. 8, 2004.

Böhringer, K.F., et al., "Modeling of Capillary Forces and Binding Sites For Fluidic Self-Assembly," *MEMS: 2001: The 14th IEEE International Conference on Micro Electro Mechanical Systems*, pp. 369-374 (2001).

Cohn, M.B., et al., "Microassembly technologies For MEMS," *SPIE Micromachining and Microfabrication, Conference on Micromachining and Microfabrication Process Technology IV*, Santa Clara, CA, 15 pages total (Sep. 21-22, 1998).

Gracias, D.H., "Forming Electrical Networks In Three Dimensions by Self-Assembly," *Science*, vol. 289, pp. 1170-1172 (Aug. 18, 2000).

Hadley, M.A., "Vertical-Cavity Surface-Emitting Laser Diodes: Design, Growth, Mode Contol and Integration by Fluidic Self-Assembly," *UMI Dissertation Services*, Sections5.4, 5.5, abd 5.6, pp. 75-81 (1994).

Saitou, K., et al., "Externally Resonated Linear Microvibromotor For Microassembly," *Journal of Microelectromechanical Systems*, vol. 9, No. 3, pp. 336-346 (Sep. 2000).

* cited by examiner

METHOD FOR ASSEMBLY OF COMPLEMENTARY-SHAPED RECEPTACLE SITE AND DEVICE MICROSTRUCTURES

CLAIM OF BENEFITS OF PROVISIONAL APPLICATION

Applicants claim the benefits of their co-pending U.S. Provisional application Serial No. 60/326,055, filed on 28 Sept. 2001.

FIELD OF INVENTION

This invention relates to the assembly of hybrid electronic and optoelectronic circuits. In one embodiment, it involves a method for assembly of such circuits known as fluidic self-assembly.

BACKGROUND OF INVENTION

Fluidic self-assembly is a fabrication process whereby individual device microstructures are integrated into receptacle sites on host electronic circuits using a liquid medium for transport. Placement and registration of the device microstructures into receptacles on a substrate carrying electronic microcircuits is controlled by shape recognition or by selective chemical adhesion or both.

Methods for fabricating device microstructures by fluidic self-assembly are known in the art. U.S. Pat. No. 5,545,291, which is incorporated herein by reference, describes one such method comprising the steps of providing a plurality of shaped blocks, each shaped block comprising an integrated circuit device thereon; transferring said shaped blocks into a fluid to form a slurry; and dispensing said slurry over a substrate at a rate where at least one of said shaped blocks is disposed into a recessed region in the substrate. In the '291 patent, the substrate is selected from a group consisting of a silicon wafer, plastic sheet, gallium arsenide wafer, glass substrate, and ceramic substrate. The rate is substantially a laminar flow and allows each of the shaped blocks to self-align into said recessed region.

In the '291 patent, the blocks comprising the integrated circuit device thereon are shaped by masking and etching. With reference to FIGS. 1–3 of the attached drawings, a block substrate 2 is provided with a top layer 4, a bottom layer 6 and a sacrificial layer 8 atop the top surface 9 of the bottom layer 6 (FIG. 1). The blocks are shaped by masking and etching the top layer using known techniques to form the etched block substrate shown in FIG. 2 comprising photoresist layer 10 atop shaped blocks 12. Then, the shaded blocks 12 are removed by preferential etching of sacrificial layer 8 (FIG. 3). The removed blocks 12 (FIG. 3) are then mixed with an inert fluid to form a slurry and the slurry is deposited on the top surface of a substrate comprising recessed regions to allow the blocks to self-align in the recessed regions of the substrate.

To insure proper placement and registration of the microstructures in the recessed regions, the recessed regions in the prior art substrates have been etched to provide receptacle sites with geometric profiles that are complementary to the profiles of the blocks. Receptacle sites in other reports of fluidic self-assembly have also been made by etching recesses in the surface of silicon substrates. Single crystalline silicon can be etched by a number of methods to produce a variety of sidewall profiles. The etching behavior of most wet-processes can be categorized as isotropic or crystallographic. Receptacles fabricated using crystallographic etches are the most favorable for forming receptacle sites.

An SEM photograph of a cystallographically etched receptacle in Si (100) using an aqueous KOH solution is shown in FIG. 4. The KOH etch generates recesses whose sidewalls are formed along (111) planes. It is difficult to produce complementary shapes between receptacles and device microstructures using this approach because the microstructures require an exterior surface etch and the receptacles require an interior surface etch. The best results for shape matching have been achieved using corner compensation masking techniques for etching the device microstructure. This technique prevents the corners from being rounded (which is observed in the microstructures in FIG. 4). In general the microstructures (outside etch) are found to be etched with a more tapered shape than the receptacle sites. This leads to a loose fit. Evidence of poor shape matching between the wet-etched microstructure devices and the Si receptacles is seen in FIGS. 4 and 5. This mismatch has been reported by other researchers in fluidic self-assembly.

An alternative method for forming receptacles in polymer surfaces is plasma etching. There have been a number of reports in the literature for forming tapered holes in polyimide. The methods for forming the tapered sidewalls involve using specially prepared photoresist masks (tapered erosion masks). These methods are typically limited to several microns of depth because the masking material and the polymer etch at the same rate. Producing asymmetric receptacles (i.e. those with different sidewall profiles) is impractical using plasma etching. Thus, forming receptacles by plasma etching for fluidic self-assembly applications is restricted to symmetric structures of limited depth.

It may be appreciated from the above that an improved method is needed to form substrates with arrays of recessed receptacle sites that precisely match the shape of particular device microstructures.

SUMMARY OF INVENTION

The present invention pertains to a method and resulting structure for assembling a device microstructure onto a substrate. The terms "device microstructure", "shaped block" and "microstructure component" are used interchangeably herein to refer to any structure comprising an integrated circuit device that may be integrated into an electronic circuit.

In one embodiment the invention provides a method for assembly comprising the steps of: (a) providing a plurality of microstructure components with each of the components having a bottom with the same three dimensional shape; (b) forming a mold with at least one protuberance from a surface thereof so that the at least one protuberance has said same shape; (c) molding a moldable substrate with the mold to form a molded substrate comprising a surface with at least one recess having said same shape; and (d) positioning a first of the plurality of microstructure components into said at least one recess. Each of the microstructure components may be formed by a masking and etching process, with the mold being formed by the same masking and etching process. In a preferred embodiment, the positioning step comprises mixing said microstructure components with a fluid to form a slurry; and depositing said slurry on the surface of said molded substrate to cause the first of the plurality of microstructure components to self-align in the recess. The fluid is preferably an inert fluid selected, for example, from the group consisting of water, acetone and alcohol. The slurry preferably includes enough fluid to allow said microstructure components to slide across the surface of the molded substrate.

In another embodiment of the invention, the molded substrate comprises a polymeric film, which preferably comprises a thermoplastic polymer. The forming step (b) may comprise impressing the mold into said moldable substrate. Alternatively, the forming step (b) may comprise injecting said moldable substrate into said mold.

In another preferred embodiment of the invention, each of the microstructure components comprises a semiconductor material with a crystalline orientation and the mold comprises the semiconductor material with the same crystalline orientation. The semiconductor material comprises, for example, silicon or gallium, arsenide, or mercury cadmium telluride.

In yet another embodiment, the method comprises forming the mold in step (b) with a plurality of protuberances having said same shape, molding the moldable substrate in step (c) with the mold to form the molded substrate with a plurality of recesses having said same shape, and depositing a slurry of the microstructure components on the surface of the molded substrate to cause respective ones of the plurality of microstructure components to self-align in the recesses.

The molded substrate preferably carries electronic microcircuits that cooperate functionally with the microstructure components. The surface of the molded substrate in which the recesses are formed may be planar and the method may comprise forming each of the plurality of recesses with a depth that is the same as a thickness of the microstructure components so that respective top surfaces of the microstructure components aligned in the recesses are coplanar. Alternatively, the surface of the substrate in which the recesses are formed may be arcuate.

In yet another embodiment, the method comprises treating the at least one recess to alter a surface property thereof whereby to promote alignment of one of the plurality of microstructures in the at least one recess.

In accordance with the invention, there is also provided a combination comprising:

(a) a plurality of microstructure components each of which has a bottom with the same three dimensional shape;

(b) a mold comprising a surface with a plurality of protrusions, each of said plurality of protrusions having said same shape; and (c) a moldable substrate.

The combination may further comprise an inert fluid, with the microstructure component being present as a slurry with said fluid. In a preferred embodiment, each of the microstructure components comprises a semiconductor material with a crystalline orientation and the mold comprises the semiconductor material with the same crystalline orientation.

DETAILED DESCRIPTION

Figure 1:
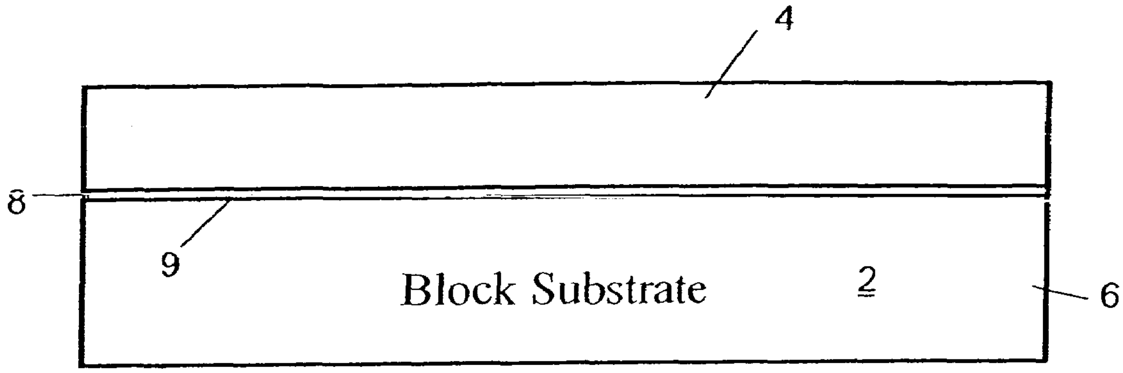
FIG. 1 is a semiconductor substrate used in a prior art process for fabricating shaped blocks with integrated circuit devices thereon.
Figure 2:
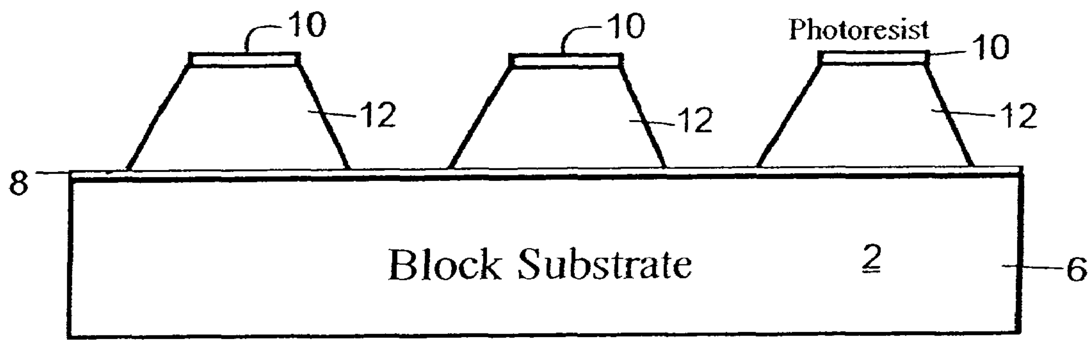
FIG. 2 is an illustration of prior art blocks etched from the substrate of FIG. 1.

The invention uses a low-cost molding process to provide a substrate with an array of recessed receptacle sites each of which has a shape that exactly matches the shape of device microstructures. The molding process involves producing a stamp or mold using the same fabrication process that is used to produce the device microstructures. In this way, both the mold and microstructures can be exterior (rather than interior) surface etches. Thus, a protrusion can be formed on the mold that is identical, in the most minute details, to the features and overall shape of the bottom of a device microstructure. This insures an optimum fit between a receptacle formed using the mold and the bottom of the microstructure. This in turn facilitates assembly of the microstructure in the receptacle.

To form the mold or stamp with protrusions having a shape that is identical to the bottom of microstructure blocks, the protrusions and blocks can be formed from respective block and mold substrates that are made of the same material. Then, the respective substrates may be patterned by the same process. Steps for patterning the respective top surfaces of the block substrate and the mold substrate are known in the art. Such steps include spreading a layer of photoresist of desired thickness over each of the respective top surfaces, and then exposing, developing and baking the respective photoresist layers. The photoresist layers on the respective top surfaces of the block substrates and mold substrate can be made of the same material and can be made to have the same thickness. The respective photoresist layers can be developed and baked in the same manner to form identical patterns on the respective top surfaces. After patterning, each of the respective top surfaces can likewise be etched in the same manner to form identical shaped protrusions on the respective block and mold substrates. The respective photoresist layers may then be removed by known techniques.

The etching processes used in forming the respective protrusions and blocks may be any etching techniques known to those of skill in the art, including wet etching, dry etching, ion milling and reactive ion etching. Such processes may be used to provide the respective block and mold substrates with protrusions of a variety of matching shapes including a cylindrical shape, rectangular shape, square shape, hexagonal shape, pyramid shape, T-shape, kidney shape, and others. The shapes may be symmetric or asymmetric. The overriding requirement is that the respective block bottoms and protuberances have matching widths, lengths and thicknesses to promote self-assembly in a desired orientation. These dimensions may vary considerably in size. Each of the width and length dimensions may, for example, range between about 1 μm and 5 mm. The thicknesses may range, for example, between about 0.5 and 100 μm. The preferred dimensions of the device microstructures and receptacle depend on the specific application. The invention may be implemented using discrete devices (diodes, transistors, detectors, etc.) and individual passive components (capacitors, resistors, inductors, etc.) that have dimensions, for example, of 1 μm×1 μm×thickness of 0.5 μm, and integrated circuits (ICs, MMICs, etc.) that have dimensions as large as 5 mm×5 mm×thickness of 100 μm.

Figure 3:
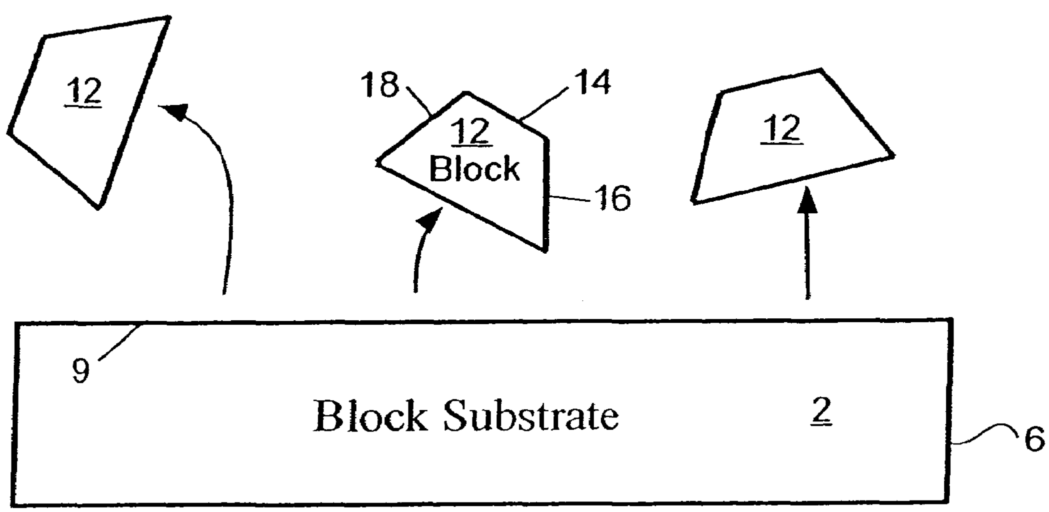
FIG. 3 is an illustration of the prior art blocks of FIG. 2 being removed from the substrate.
Figure 4:
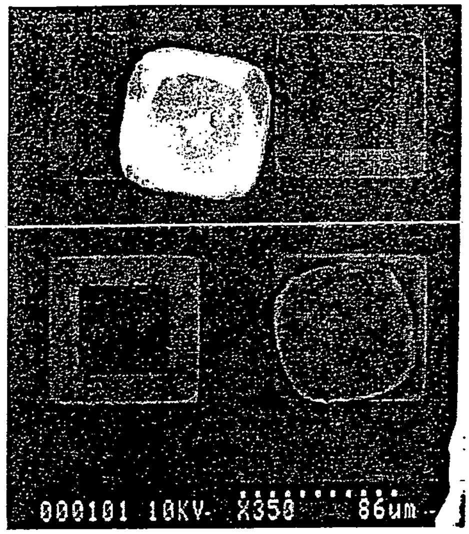
FIG. 4 is a photomicrograph of four (4) prior art receptacle sites and two (2) device microstructures prepared by wet-chemical etching; the photomicrograph shows the different shapes obtained by wet-etching interior (receptacle) and exterior (microstructure) surfaces.
Figure 5:
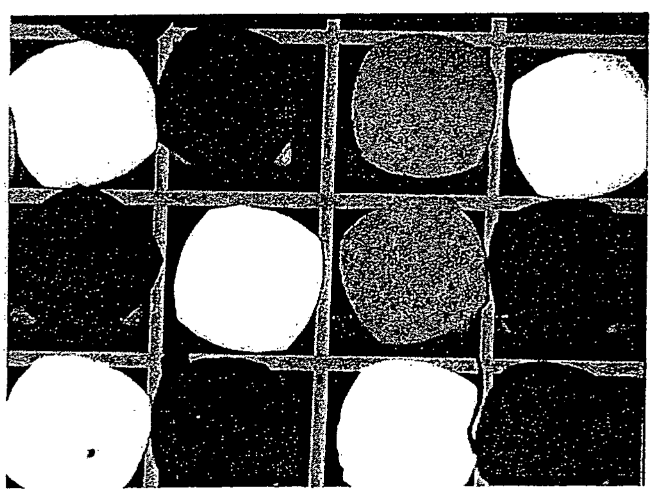
FIG. 5 is a photomicrograph showing an assembled array of larger Si microstructures (550 μm×550 μm) in receptacles etched into a silicon (100) surface according to a prior art method; the misalignment of the microstructures in the recesses is evidence of the poor shape matching.
Figure 6A:
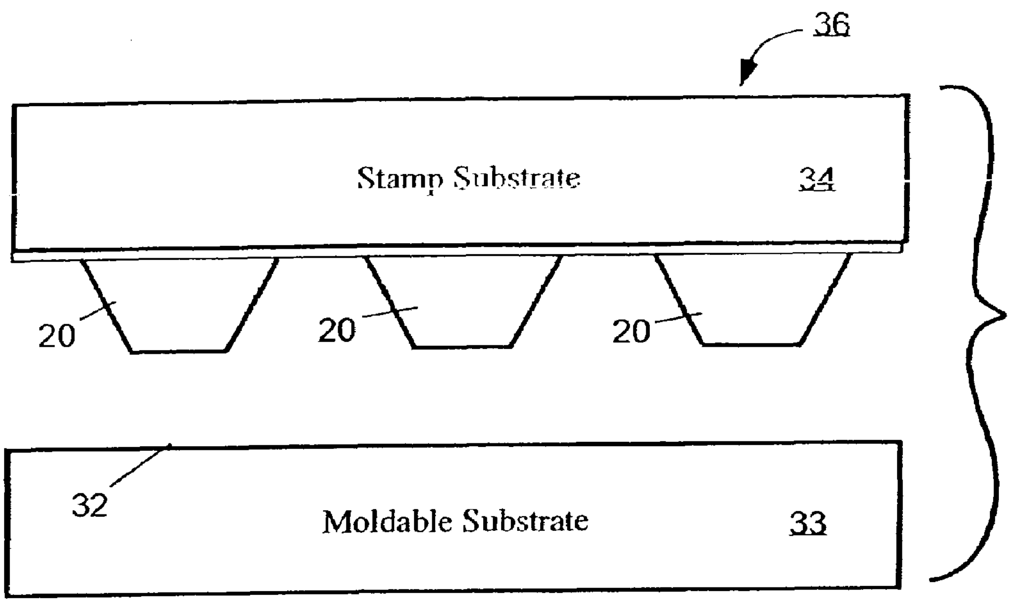
FIG. 6A is an illustration of a stamp fabricated in accordance with the invention and a moldable substrate preparatory to stamping of the moldable substrate.
Figure 6B:
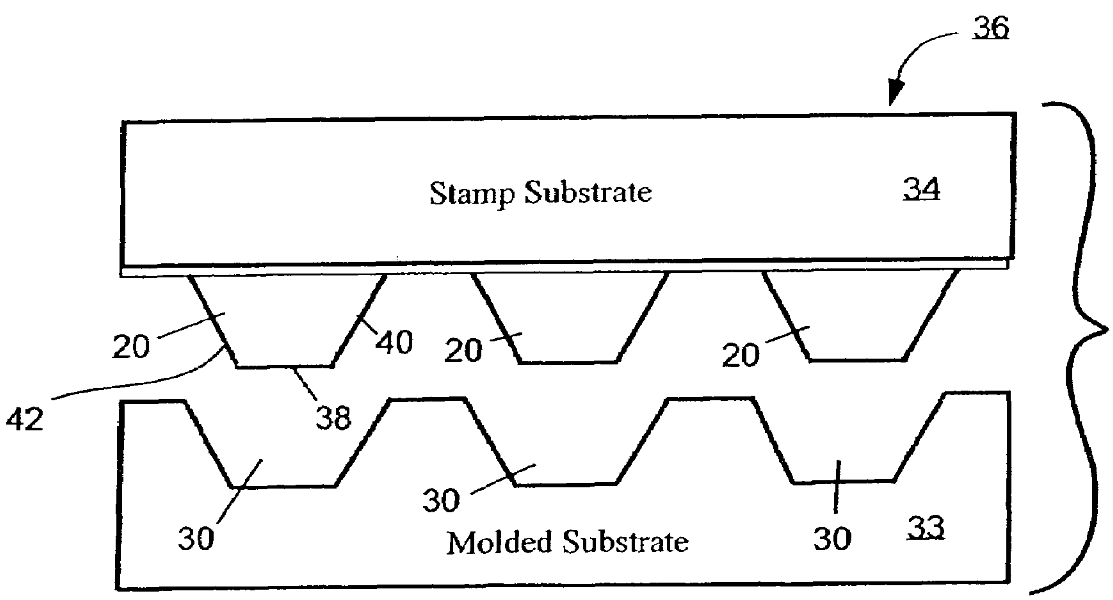
FIG. 6B is an illustration of the stamp and moldable substrate of FIG. 6A after stamping of the moldable substrate.

With reference to the drawings, FIGS. 6A and B depict a mold or stamp 36 that has been etched from substrate 34 with protrusions 20 having a shape that matches exactly the shape of the bottom of microstructure blocks, which bottom comprises base 14 and sidewalls 16 and 18 (FIG. 3). In FIG. 6A of the drawings, the mold or stamp 36 is shown preparatory to impressing the shape into a surface 32 of moldable substrate 33. In FIG. 6B the mold 36 and (now) molded substrate 33 are shown after a stamping operation in which the protrusions 20 are impressed or stamped into the substrate 33 to form the substrate with shaped recesses 30 of the desired shape.

To produce the recesses 30 in the moldable substrate 33 according to a preferred embodiment of the invention, the stamp or mold 36 is heated to an elevated temperature dependent on the characteristics of the material forming the substrate and is then pressed against the substrate. The combination of the heat and pressure causes the moldable substrate 33 to be deformed so that the recesses 30 are formed in the substrate 33 with the shape of the bottom 38, 40, 42 of the stamp or mold 36. Alternatively or in addition to the heating of the stamp or mold 36, the moldable substrate 34 may be heated to facilitate the deformation thereof.

Methods for stamping recesses in deformable substrates are known in the art as described, for example, in U.S. Pat. No. 4,912,844 which is incorporated herein by reference. The elevated temperature to which the substrate is heated is dependent upon the material of the substrate 33. As will be appreciated, this elevated temperature is preferably below the melting temperature of the material forming the substrate. Preferably the elevated temperature approaches the melting temperature of the substrate to facilitate the deformation of the substrate by the stamp 34 such that the recesses 30 are formed. The substrate 33 can be heated to an elevated temperature. This elevated temperature is below the melting temperature of the substrate 33 but approaches the melting temperature of the substrate to facilitate the deformation of the substrate by the stamp for the formation of the recesses 30.

The deformable or moldable substrate 33 may comprise any material having properties of becoming deformed at local positions when subjected to heat and to pressure at such local positions. For example, thermoplastic or thermoset polymers may be used, with thermoplastic polymers being preferred.

Suitable thermoplastic polymer films may be selected based on their forming temperature, electrical properties, and other physical properties. Table 1 lists a representative set of commercially available thermoplastic films and some selected properties.

TABLE 1

SELECTED PROPERTIES OF REPRESENTATIVE DIELECTRIC THERMOPLASTIC POLYMERS.

| Thermoplastic Dielectric Material | Glass Transition Temperature | Coefficient of Linear Expansion | Dielectric Consant |
|---|---|---|---|
| Polyimide | 250° C. | 55 × $10^{-6}$ cm/cm/K | 2.5 |
| Ethylene-chlorotrifluoroethylene | 190° C. | 5.6 × $10^{-6}$ cm/cm/K | 2.5 |
| Polyvinylidene Fluoride | 165° C. | | 8–10 |
| Polyetherimide | 142° C. | 52 × $10^{-6}$ cm/cm/K | 3.15 |

The glass transition of the thermoplastic polymer sets the processing temperature necessary for molding. It is important that after forming the receptacle structures that the polymer not exceed the glass transition temperature. However, the lower the glass transition the easier it is to mold the thermoplastic. Useful glass transition temperatures ranges are from ~100–250° C. Stacking of the polymer layers requires that every layer in the stack have a lower glass transition than the one(s) below it.

The dielectric constant should be as high as possible (i.e. non-conducting materials). For high frequency RF applications both the dielectric constant and the loss tangent of the material are important. These relate to the signal loss and power consumption of the electronics.

The thermal expansion coefficient should be as low as possible. Most semiconductors have about a factor of ten lower thermal expansion coefficient. The difference can cause stress in the pair after bonding, although the polymer is pliable and can deform.

Figure 7:
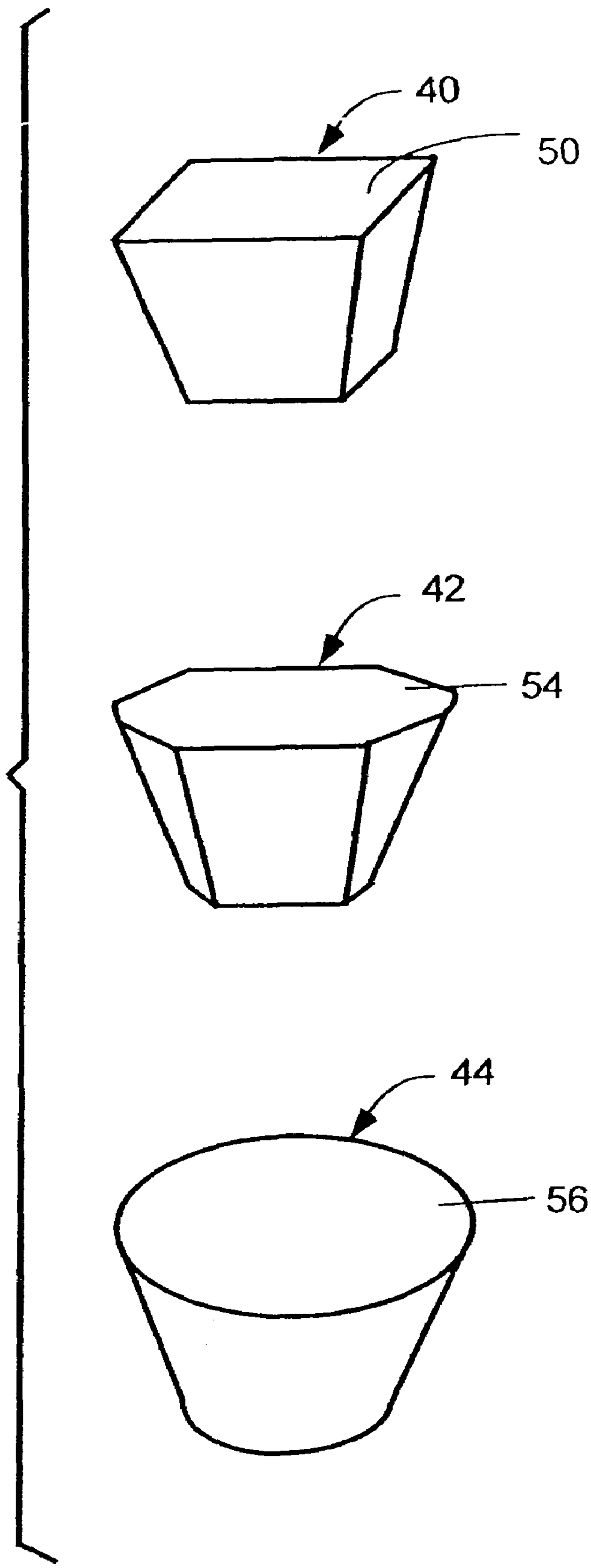
FIG. 7 is an illustration of examples of shaped blocks.

The stamp 36 and blocks 12 may be made of semiconductor materials, including by way of example, silicon or gallium arsenide. The use of stamps made of semiconductor materials provides a low-cost means to produce arrays of precisely patterned receptacles in polymer films. The stamp face is fabricated using standard processes, including: photolithography, wet chemical etching and/or dry etching techniques. A wide variety of sidewall shapes and angles can be obtained by employing different etching procedures and/or by selecting different crystallographic orientations and masking procedures on the stamp face. For example, stamps can be fabricated which form recesses which match identically the respective bottoms of any of the blocks shown in FIG. 7. The respective bottoms of these blocks include all surfaces except for top surfaces 50, 52 and 54 respectively. So, for example, recesses can be formed to match the shapes and angles of the base and sidewalls of any one of blocks 40, 42 or 44. Moreover, the depth of the recesses can be controlled to match exactly the thickness of a microstructure device. This would allow interconnects between microstructure devices integrated into a substrate to be coplanar.

In another embodiment of the invention, the mold or stamp 36 may be used to form a polymer film with recesses of the desired shape by injection molding. In this embodiment, a molten polymer precursor is injected into a cavity of an injection mold comprising the stamp 34, with the stamp 36 forming an inner wall of the mold cavity. The molten polymer precursor is then pressed against the inner wall for a time sufficient for the precursor material to cool whereby to form the polymer film with the recess of the desired shape. The resultant film can then be ejected from the injection mold.

The invention provides an improved assembly method to allow mass placement and alignment of electronic components on circuit assembly templates (to make advanced microelectronic and optoelectronic systems). In U.S. Pat. No. 5,545,291 transfer procedures involving fluidic self-assembly are described based upon the complementary shapes of the microstructure components and the recesses in the substrate. Also described in the '291 patent (and incorporated herein by reference) are methods for attaching the components in the recesses by way, for example, of a eutectic layer or a synthetic adhesive. The present invention provides an extension of the shape-based fluidic self-assembly procedures of the '291 patent to include molecular-based self-assembly. The modification of the surface properties of the polymers, used to make the circuit assembly templates, is one way to enhance the assembly of device components over that obtainable using shape recognition alone. Molecular forces (i.e. van der Waals, electrostatic, and capillary) become increasingly important over gravitational forces (shape-based assembly) as the size of the device microstructure decreases (the breakpoint is ~100 μm in size).

In co-pending application serial number filed on the same date as the present application and entitled "Method of Self-Latching for Adhesion During Self-Assembly of Electronic or Optical Components" (the contents of which are hereby incorporated herein by reference), inventors A. T. Hunter and P. D. Brewer describe a method for permanently causing self-assembled components to adhere to surface recesses or other receptacles. The method comprises (a) selectively coating at least a first receptor site of the substrate with a liquid precursor that forms a solid adhesive upon contact with an initiator; (b) providing each of the components with an adhesion surface that has the initiator; and (c) depositing the components on the substrate in a manner that causes a first of the components to contact the at least first receptor site whereupon contact between the initiator and the liquid precursor causes formation of the adhesive which affixes the first compound to the first receptor site. In a preferred embodiment, the precursor is a liquid monomer and the initiator initiates a polymerization reaction upon contact with the monomer to form a solid polymer. While the present invention does not require the use of any particular process to lock components in place after they are assembled into receptacles, the techniques in the present and co-pending applications can be used together to improve the efficiency of the assembly operation.

The present invention for molding thermoplastic polymers takes advantage of both shape recognition (gravity-based assembly into holes) and molecular-based mechanisms. With that in mind, it is desirable to have polymer surfaces that can be modified to have both hydrophobic and hydrophilic properties. In accordance with this aspect of the invention, an oxygen plasma treatment may be used to cause the originally hydrophobic surface of the polymer to be rendered hydrophilic. There are at least two possible ways to implement the modification of the polymer surface properties to enhance assembly. One procedure depends on rendering hydrophobic those surfaces for which one desires adhesion (the bottoms of the receptacles and, using separate means, the bottoms of the device microstructures) with all other surfaces of the polymer hydroplilic. In this case the assembly takes place in a polar fluid such as water and the reduction of the high energy water-hydrophobic polymer interface drives the assembly of the device microstructure into the receptacle site. The location of the device microstructure into the receptacle sites eliminates this high energy surface energy and results in the tight binding of the component into the site. Alternatively, the hydrophilic surfaces can be used for adhesion. In this case the liquid medium would be non-polar (hydrophobic). The energy of the system is again driven to a minimum when the device microstructures are located in the receptacles since this eliminates the higher energy hydrophobic (liquid)-hydrophilic (receptacle surface) interface.

A preferred plasma treatment in accordance with this aspect of the invention involves exposing the polymer surface to a low-pressure oxygen electrical discharge. The discharge splits the oxygen molecules ($O_2$) into its more reactive atomic form (O). This atomic oxygen chemically reacts with the surface of the polymer film that changes its surface properties. The process we employ involves a short (<1 min) exposure to the oxygen plasma in a parallel plate plasma etching system.

There are other preferred treatments that can also accomplish a molecular-based self assembly. For example, a known method relies on utilizing chemically-based thermodynamic tendencies to assemble structures without requiring the handling of individual components. This method may be used to provide self-assembly in the nanometer scale range.

EXAMPLES

Figure 8:
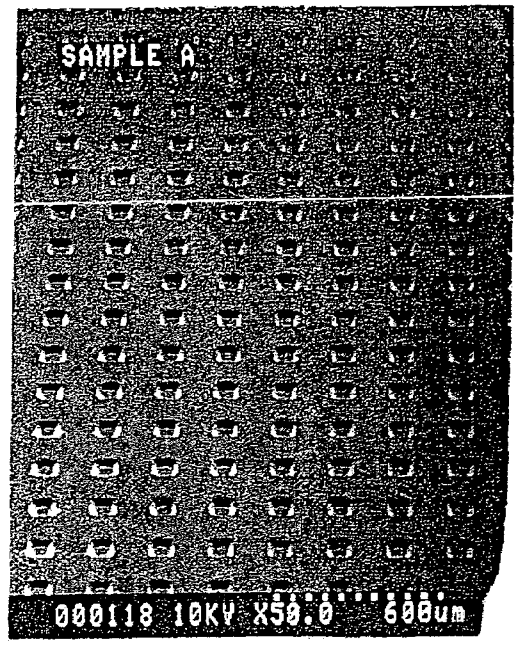
FIG. 8 is a photomicrograph of an array of receptacle sites fabricated by compression molding in a polymer film in accordance with the invention.

To show the operation of the invention, the inventors have assembled microstructure components into recesses formed in polymeric films using the method of the invention. FIG. 8 shows an array of receptacles formed in a polymer film by compression molding using this invention. The stamp used to form this impression was prepared from a silicon (100) wafer that was patterned using a wet-chemical (KOH) etch. The surface of the stamp was also treated chemically to allow easy release from the polymer after molding. This treatment involved making the silicon surface hydrophobic. This involved depositing a continuous Cr/Au film on the stamp surface and then forming an ordered organic monolayer (self-assembled monolayers, SAMS) on the Au surface. A detailed description of the preferred procedures used to fabricate the complementary shaped stamp and microstructures follows next.

Figure 11:
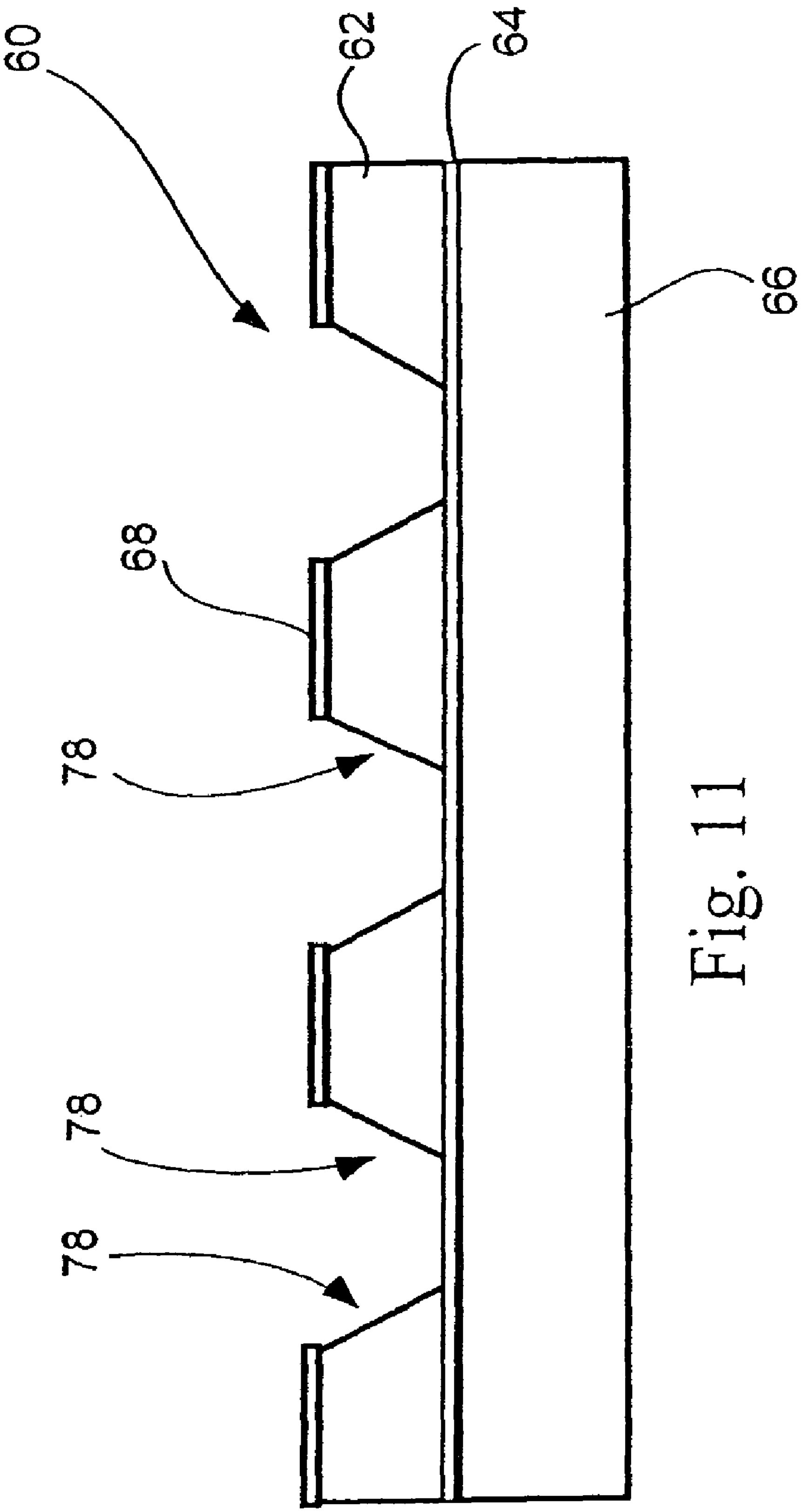
FIG. 11 is an illustration of truncated pyramidal device microstructures etched in a (100) silicon-on-insulator wafer in accordance with a preferred embodiment of the invention.

With reference to FIG. 11, the device microstructures are fabricated using a commercially available silicon-on-insulator ("SOI") wafer 60 that consists of a 20 μm thick Si (100) device quality layer 62 on a 4 μm thick $SiO_2$ film 64 on a thick (600 μm) Si substrate 68. A 400-nm thick silicon nitride (SiN) film 68 is vacuum deposited on the active-side of the SOI wafer. The SiN film 68 is patterned using standard photolithographic procedures and is etched using $CF_4$ reactive ion etching (RIE). The patterned SiN layer 68 acts as a mask for subsequent etching steps (that use potassium hydroxide (KOH) solutions) for defining the bottom of the device microstructure. By providing a mask pattern (say, a square or rectangular shape) that is accurately aligned with the primary orientation flat (i.e. [110] direction) only {111} planes will be introduced as sidewalls throughout the etching process. The nonetching character of the Si {111} planes renders an exceptional degree of predictability to the microstructures etched features. During etching, truncated pyramids deepen but do not widen. The edges in these structures are <110> directions, the ribs are <211> directions, the sidewalls are {111} planes, and the small side is the original (100) plane. The KOH solution stops etching when it reaches the underlying oxide layer. At this point, the device microstructures (the truncated pyramids 78 in FIG. 11) are etched briefly in a HF solution, to remove the underlying oxide layer 64 and release the microstructures.

The master stamp is fabricated using a similar procedure. The master stamp is made from silicon (100) wafers. A 400-nm thick silicon nitride (SiN) film is vacuum deposited on the silicon wafer. The SiN films are patterned using standard photolithographic procedures are etched using a $CF_4$ reactive ion etching (RIE). The patterned SiN pads are accurately aligned with the primary orientation flat (i.e. [110] direction) only {111} planes will be introduced as sidewalls throughout the etching process. The edges in these structures are <110> directions, the ribs are <211> directions, the sidewalls are {111} planes, and the small side is the original (100) plane. The etching of the truncated pyramidal structures on the master stamp is monitored periodically to achieve identical depths as the thickness of the device microstructures. After etching the 500 Å thick Cr/Au layer is deposited on the stamp face. The final step consists of soaking the Au layers overnight in a 2-mM solution of hexadecanethiol in ethanol to produce a hydrophobic surface (<50 Å thick). This layer is used as a release agent in the stamping process.

As can be seen, identical fabrication procedures are used to produce the complementary shapes of the master stamps (used to mold the receptacles in the polymer films) and the device microstructures. The stamp and the microstructure devices are made from the same semiconductor materials and the same crystallographic orientation. These factors ensure that the identity of the master stamps and the device microstructures are exact to within the resolution of the photolithography process (typical <0.1 microns) used to make them.

The polymer film (1 mil thick) in all examples reported here was a polyetherimide thermoplastic. This film can be molded at temperatures above 175° C. with compression force of 600–800 psi. The stamping process has been successfully demonstrated on wafers as large as 3" diameter.

Figure 9:
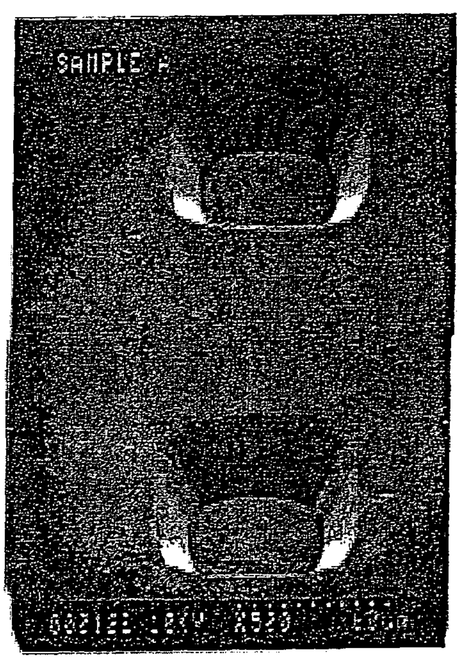
FIG. 9A is a photomicrograph of compression molded receptacle sites in a thermoplastic film.
FIG. 9B is a photomicrograph of silicon device microstructures prepared by wet-chemical etching with all physical features of the wet-etched silicon stamp transferred to the molded impression.
Figure 9:
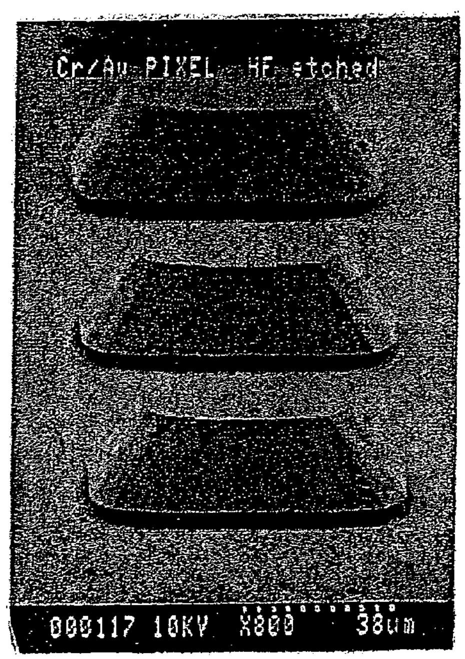

FIG. 9A shows magnified images of the receptacle sites. The crystallographic facets of the Si (100) stamp are flawlessly reproduced in the stamped impression. Identical features are also observed for the device microstructures, shown in FIG. 9B, which are produced using the same procedure as that for the stamp surface. Producing receptacles and microstructures with identical shapes is possible with this invention. Asymmetrically shaped receptacle sites have also been formed using (211) oriented silicon material. The ability to form asymmetric features is a unique capability of the molding process of the invention and is beyond the capability of other techniques.

Figure 10:
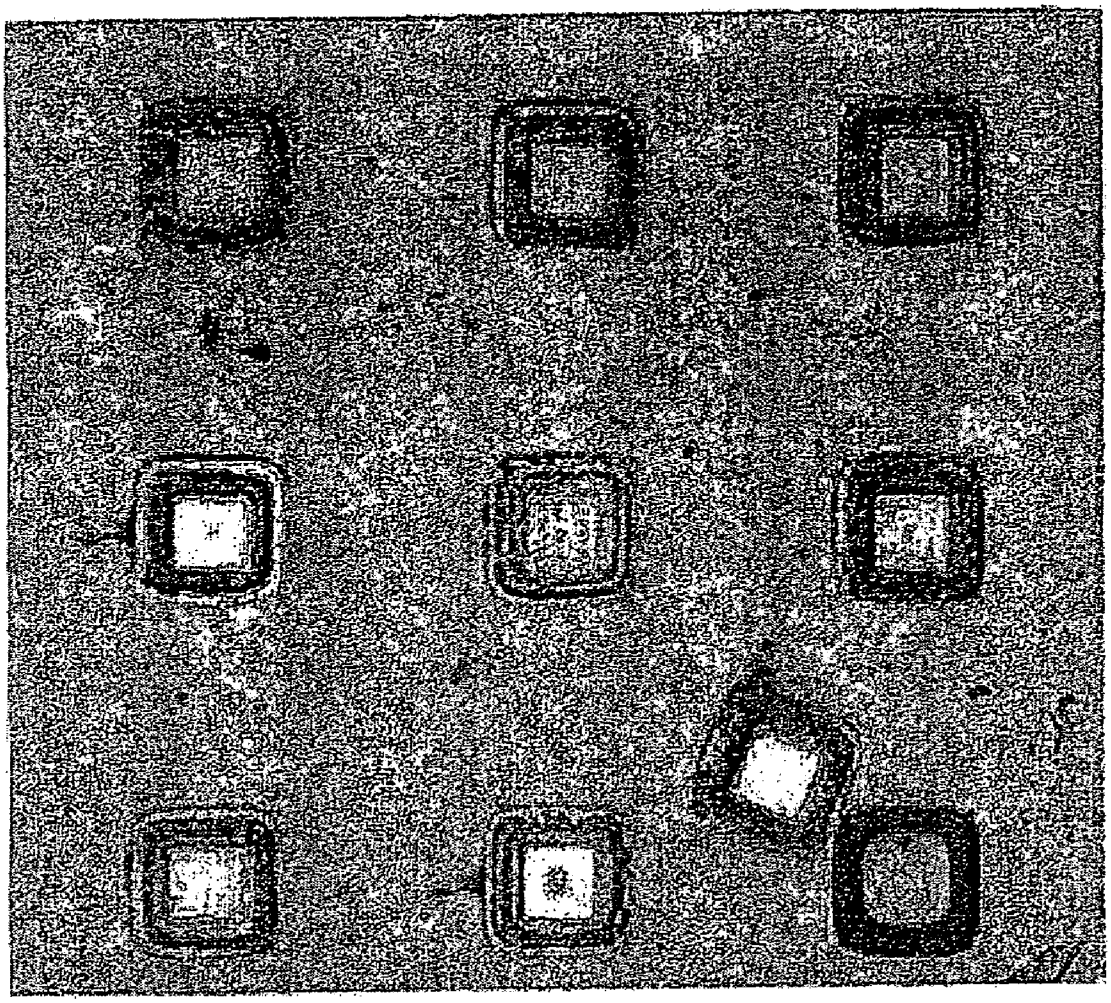
FIG. 10 is a photomicrograph of 80×80 μm device microstructures captured in a molded substrate in accordance with the invention.

FIG. 10 shows an example of assembling arrays of microstructures in the molded receptacle sites. In this example, fluidic self-assembly (FSA) methods were employed. The microstructures were entrained in ethanol and allowed to flow over the surface of the polymer. Without exact shape matching between the microstructures and the receptacle sites, the probability for capture using FSA is extremely low for these size structures (~0.1%). The enhanced aperture probability as observed in FIG. 10 demonstrates the benefit of this new invention. The optical microscope picture of a 3×3 pattern of captured pixels shows one empty receptacle, and one extra microstructure adhering to the surrounding polymer film. The device microstructures adhere very weakly to the surrounding polymer film, and can be removed without disturbing those in the receptacles.

Although the invention has been described above with respect to fluidic self-assembly methods, it will be appreciated by those of skill in the art that the invention also benefits a pick-and-place assembly method. This method is used physically to locate (pick) and position (place) components on a circuit template using robotic tools. Although this method can be automated to place parts on a template, much time is spent in precisely positioning and aligning individual components to the underlying circuit pattern. The invention enables the use of tapered receptacles and device structures that allow these parts to slide into position into surface recesses. With this scheme the alignment precision is transferred from the serial placement process to the parallel stamping process. The use of tapered assembly recesses and components significantly eases the accuracy requirements of the robotic placement step.

This invention will benefit electronic packaging technology and the assembly of hybrid electronic and optoelectronic systems. The benefits extend to, but are not limited to, the areas of locating and positioning micro-device structures to an underlying circuit, planarizing the interconnect level of hybrid electronic and optoelectronic assemblies, and for positioning and supporting multi-level stacked device structures. The benefits include the ability:

(1) to form receptacles with the exact shape match to the device microstructures (this will improve techniques such as fluidic self-assembly);

(2) to control the depth of the recessed receptacles to exactly match the thickness of the device microstructure (this allows the interconnects between devices to be coplanar);

(3) to form receptacles with asymmetric sidewall angles;

(4) to form receptacles on curved surfaces;

(5) to tailor surface properties of the receptacle by selective exposure to an oxygen plasma source; and (6) to form multi-level stacks of device structures by repeated application of this technique.

While there have been shown and described specific embodiments of the present invention, further modifications and improvements will occur to those skilled in the art. It should be understood, therefore, that this invention is not limited to the particular forms shown and that the appended claims are intended to cover all modifications that do not depart from the spirit and scope of this invention as defined by the following claims.

What is claimed is:

1. A method for assembly comprising the steps of:

(a) providing a plurality of microstructure components with each of the components having a bottom with the same three dimensional shape;

(b) forming a mold with at least one protuberance from a surface thereof so that the at least one protuberance has said same shape;

(c) molding a moldable substrate with the mold to form a molded substrate comprising a surface with at least one recess having said same shape; and (d) positioning a first of the plurality of microstructure components into said at least one recess.

2. A method for assembly according to claim 1, wherein each of the microstructure components is formed by a masking and etching process, said mold being formed by the same masking and etching process.

3. A method for assembly according to claim 1, wherein said positioning step comprises mixing said microstructure components with a fluid to form a slurry; and depositing said slurry on the surface of said molded substrate to cause the first of the plurality of microstructure components to self-align in the recess.

4. A method for assembly according to claim 3, wherein said fluid is an inert fluid.

5. A method for assembly according to claim 3, wherein said slurry includes enough fluid to allow said microstructure components to slide across the surface of the molded substrate.

6. A method for assembly according to claim 1, wherein said molded substrate comprises a polymeric film.

7. A method for assembly according to claim 6, wherein the polymeric film comprises a thermoplastic polymer.

8. A method for assembly according to claim 1, wherein said forming step (b) comprises impressing the mold into said moldable substrate.

9. A method for assembly according to claim 1, wherein said forming step (b) comprises injecting said moldable substrate into said mold.

10. A method for assembly according to claim 1, wherein each of the microstructure components comprises a semiconductor material with a crystalline orientation and the mold comprises the semiconductor material with the same crystalline orientation.

11. A method for assembly according to claim 10, wherein the semiconductor material comprises silicon or gallium arsenide or mercury cadmium telluride.

12. A method for assembly according to claim 1, comprising forming the mold in step (b) with a plurality of protuberances having said same shape, molding the moldable substrate in step (c) with the mold to form the molded substrate with a plurality of recesses having said same shape, and depositing a slurry of the microstructure components on the surface of the molded substrate to cause respective ones of the plurality of microstructure components to self-align in the recesses.

13. A method for assembly according to claim 12, wherein the molded substrate carries electronic microcircuits that cooperate functionally with said microstructure components.

14. A method for assembly according to claim 12, wherein the surface of the molded substrate in which the recesses are formed is planar.

15. A method for assembly according to claim 14, comprising forming each of the plurality of recesses with a depth that is the same as a thickness of the microstructure components so that respective top surfaces of the microstructure components aligned in the recesses are coplanar.

16. A method for assembly according to claim 12, wherein the surface of the substrate in which the recesses are formed is arcuate.

17. A method for assembly according to claim 12, comprising treating the at least one recess to alter a surface property thereof whereby to promote alignment of one of the plurality of micro structures in the at least one recess.

* * * * *